US012660112B2

(12) United States Patent
Wang et al.

(10) Patent No.: US 12,660,112 B2
(45) Date of Patent: Jun. 16, 2026

(54) ELECTRICAL DEVICE WITH POTTING MATERIAL

(71) Applicant: SIGNIFY HOLDING B.V., Eindhoven (NL)

(72) Inventors: Wenting Wang, Shanghai (CN); Jiayun Cao, Shanghai (CN); Yingdi Zhang, Shanghai (CN)

(73) Assignee: SIGNIFY HOLDING B.V., Eindhoven (NL)

( * ) Notice: Subject to any disclaimer, the term of this patent is extended or adjusted under 35 U.S.C. 154(b) by 120 days.

(21) Appl. No.: 18/840,980

(22) PCT Filed: Feb. 16, 2023

(86) PCT No.: PCT/EP2023/053900
§ 371 (c)(1),
(2) Date: Aug. 23, 2024

(87) PCT Pub. No.: WO2023/161121
PCT Pub. Date: Aug. 31, 2023

(65) Prior Publication Data
US 2025/0169014 A1 May 22, 2025

(30) Foreign Application Priority Data

Feb. 25, 2022 (WO) ................ PCT/CN2022/077905
Apr. 11, 2022 (EP) ..................................... 22167532

(51) Int. Cl.
*H05K 5/06* (2006.01)
*H05K 5/02* (2006.01)

*F21V 31/00* (2006.01)
*H05K 7/14* (2006.01)

(52) U.S. Cl.
CPC ........... *H05K 5/064* (2013.01); *H05K 5/0217* (2013.01); *F21V 31/005* (2013.01); *H05K 7/1427* (2013.01)

(58) Field of Classification Search
None
See application file for complete search history.

(56) References Cited

U.S. PATENT DOCUMENTS

| | | | |
|---|---|---|---|
| 6,614,108 B1 | 9/2003 | Sanftleben et al. | |
| 9,661,773 B2 | 5/2017 | Mijac et al. | |
| 10,352,551 B2 * | 7/2019 | Van Asselt | ............ H05K 1/056 |
| 2018/0109659 A1 * | 4/2018 | Zhao | .................... H05K 5/0217 |
| 2022/0061179 A1 * | 2/2022 | Ahmed | .................. H05K 1/189 |

FOREIGN PATENT DOCUMENTS

| | | |
|---|---|---|
| CN | 204014352 U | 12/2014 |
| CN | 213207346 U | 5/2021 |
| JP | H09321446 A | 12/1997 |
| WO | 2011013509 A1 | 2/2011 |

* cited by examiner

*Primary Examiner* — Xanthia C Relford
*Assistant Examiner* — Xanthia C Cunningham

(57) ABSTRACT

A mechanism for providing ingress protection for an electrical device. A protective element is coupled between an electrical element and a support element supporting the electrical element. Potting material covers exposed areas of the electrical element, support element and protective element. The adhesion between the protective element and the potting material is greater/stronger than between the support element and the potting material.

13 Claims, 4 Drawing Sheets

ELECTRICAL DEVICE WITH POTTING MATERIAL

CROSS-REFERENCE TO PRIOR APPLICATIONS

This application is the U.S. National Phase application under 35 U.S.C. § 371 of International Application No. PCT/EP2023/053900, filed on Feb. 16, 2023, which claims the benefit of International Application No. PCT/CN2022/077905, filed on Feb. 25, 2022 and European Patent Application No. 22167532.5, filed on Apr. 11, 2022. These applications are hereby incorporated by reference herein.

FIELD OF THE INVENTION

The present invention relates to the field of electrical devices, and in particular, to electrical devices that have undergone a potting procedure.

BACKGROUND OF THE INVENTION

There is an increasing need and desire for electrical devices, such as those used for lighting arrangements, to be located in exposed and/or damp environments, e.g., outdoors. In such environments, there is a need to protect any electrical elements of the electrical devices from the ingress of foreign matter, such as water, dust or corrosive agents.

One common approach for achieving this level of protection is to perform a potting procedure on the electrical device. A potting procedure, or simply potting, comprises filling the electrical device with a potting material or potting compound, such as glue or resin. The potting material effectively encapsulates the electrical elements to protect them from foreign matter. The potting material thereby acts as a barrier to foreign matter.

However, over time, foreign material may penetrate through the potting material and come into contact with the electrical elements. There is a desire to reduce the likelihood of penetration of, and/or increase the length of time required for penetration of, the potting material by foreign matter.

SUMMARY OF THE INVENTION

The invention is defined by the claims.

According to examples in accordance with an aspect of the invention, there is provided an electrical device comprising: an electrical element; a support element for supporting the electrical element; a protective element coupled between the electrical element and the support element; and potting material configured to cover exposed areas of the electrical element, exposed areas of the support element and exposed areas of the protective element, wherein the adhesion between the protective element and the potting material is stronger than the adhesion between the support element and the potting material.

It has been herein recognized that directly supporting an electrical element on a support element will result in the existence of very little or no potting material between the support element and the electrical element. In these circumstances, if foreign matter (such as water) reaches the support element, then leakage to the electrical element can occur quickly.

Proposed embodiments provide a protective element for the electrical element, which is disposed between the electrical element and the support element. The protective element provides a barrier between the support element and the electrical element, to reduce a likelihood of foreign matter moving directly (i.e., foreign matter creepage) from the support element to the electrical element.

The protective element also has a higher adhesion with the potting material than the support element. This means that, even if an adhesion between the support element and the potting material fails (e.g., allowing the passage of foreign matter to the support element), then the potting material covering exposed areas of the protective element can still act to protect the electrical element from foreign matter, e.g., by preventing the movement of foreign matter (i.e., foreign matter creepage) from the support element and along the surface of the protective element.

In this way, the strong adhesion between the protective element and the potting material can together act to reduce a likelihood of foreign matter ingress towards the electrical element.

Exposed areas may include any area that would be otherwise directly exposed to air if the potting material were absent. An electrical element is any structure or apparatus that carries one or more electrical components and/or conductive elements.

The electrical device may further comprise a housing configured to house or encapsulate the electrical element. The support element may be coupled to the housing and is configured to support the electrical element within the housing. The potting material may be used to effectively fill the housing.

The support element may be configured to support the electrical element away from at least one side of the housing. Thus, the housing may comprise one or more sides, and the support element may be configured to separate or distance the electrical element away from at least one of the one or more side(s), e.g., to create a gap between the side(s) and the electrical element.

In this way, the support element may act to distance the electrical element from at least one side of the housing. This avoids the electrical element resting directly upon the housing, which would a direct path for foreign matter ingress within the housing towards the electrical element (e.g., along an inner surface of the side of the housing). Thus, a foreign matter protection for the electrical element is increased.

In some examples, the surface energy of the protective element is greater than the surface energy of the support element. Generally, a higher surface energy increases an ease and strength of bonding or adhesion.

In some examples, the surface energy of the protective element is no less than 35 mJ/m$^2$. In particular, the surface energy of the protective element may be no less than 38 mJ/m$^2$, or no less than 40 mJ/m$^2$. It is recognized that a material having a sufficiently high surface energy provides good, and long-lasting adhesion to common or standard potting materials. Experimental analysis has identified that a minimum surface energy of 35 mJ/m$^2$ provides sufficiently strong and long-lasting adhesion for avoiding or reducing a chance of foreign matter ingression (to the electrical element) over a suitable period of time for desired lifetimes of electrical devices.

In some embodiments, the electrical element comprises a circuit board, such as a printed circuit board. The electrical element may, for instance, comprise one or more electrical components (e.g., resistors, capacitors, inductors, semi-conductor devices, microprocessors etc.) mounted upon the circuit board. The circuit board may comprise one or more electrical connectors or paths between any such electrical components.

In one example, the electrical element comprises a driving arrangement for a lighting arrangement. The driving arrangement may be mounted on and/or formed in the circuit board. Proposed electrical devices are particularly suited for driving arrangements, as there is a particular desire to provide lighting in exposed environments. Lighting systems requires driving arrangements, which negatively suffer from exposure to foreign matter such as water or moisture.

The protective element may be configured to wrap around a portion of an edge of the circuit board. Wrapping an edge of the circuit board provides an effective mechanism for reducing or avoiding the electrical element from coming into contact with the support element, as well as providing a strong and stable area to which the protective element can be secured.

The protective element may be configured to cover a portion of at least three surfaces of the circuit board. In this way, the protective element may act as a clamp or grip to improve a stability of the circuit board.

The protective element may be formed of silicone, plastic, rubber and/or a composite of silicone, plastic, rubber, polymeric material, and/or a composite of silicone, plastic, rubber and/or polymeric material. The protective element may, for example, be formed of silicone, silicone rubber, styrene-butadiene rubber, polyamide or nylon, polyurethane, poly(methylmethacrylate), polystyrene, poly(vinylchloride) and/or polyethylene terephthalate.

These elements provide suitable examples of protective elements having a sufficiently high surface energy to perform strong and long-lasting adhesion to potting material.

The protective element may comprise one or more fasteners configured to fasten or secure the protective element to the electrical element. This approach improves a stability of the electrical element to reduce or mitigate unwanted movement between the electrical element and the protective element which, over time, could undesirably create a path for ingress of foreign material toward the electrical element.

In some examples, each of the one or more fasteners comprises: a first fastening portion sized and/or configured to pass through a hole of the electrical element; and a second fastening portion configured to engage with the first fastening portion to thereby prevent or restrict the movement of the first fastening portion through the hole of the electrical element, to thereby fasten or secure the protective element to the electrical element.

The second fastening portion may be configured to clip to the first fastening portion to thereby engage with the first fastening portion. Use of such a clipping mechanism improves an ease and efficiency of installing or manufacturing the electrical device, as well as providing a strong and reliable securing mechanism.

The potting material may comprise a silicon-based resin, an epoxy resin, a polyurethane-based glue or tar. However, other suitable examples of potting material will be readily apparent to the skilled person.

The electrical device may comprise: a plurality of support elements for supporting the electrical element; a plurality of protective elements, each protective element being coupled between the electrical element and a respective support element, wherein: the potting material is configured to cover exposed areas of each support element and exposed areas of each protective element; and the adhesion between each protective element and the potting material is greater than the adhesion between each support element and the potting material.

It may be advantageous to support an electrical element in an electrical device using multiple support elements to improve a distribution of the support for structural stability and provide redundancy. A protective element may be provided for each support element, to achieve previously described advantages for each support element.

These and other aspects of the invention will be apparent from and elucidated with reference to the embodiment(s) described hereinafter.

BRIEF DESCRIPTION OF THE DRAWINGS

For a better understanding of the invention, and to show more clearly how it may be carried into effect, reference will now be made, by way of example only, to the accompanying drawings, in which.

DETAILED DESCRIPTION OF THE EMBODIMENTS

Figure 1:
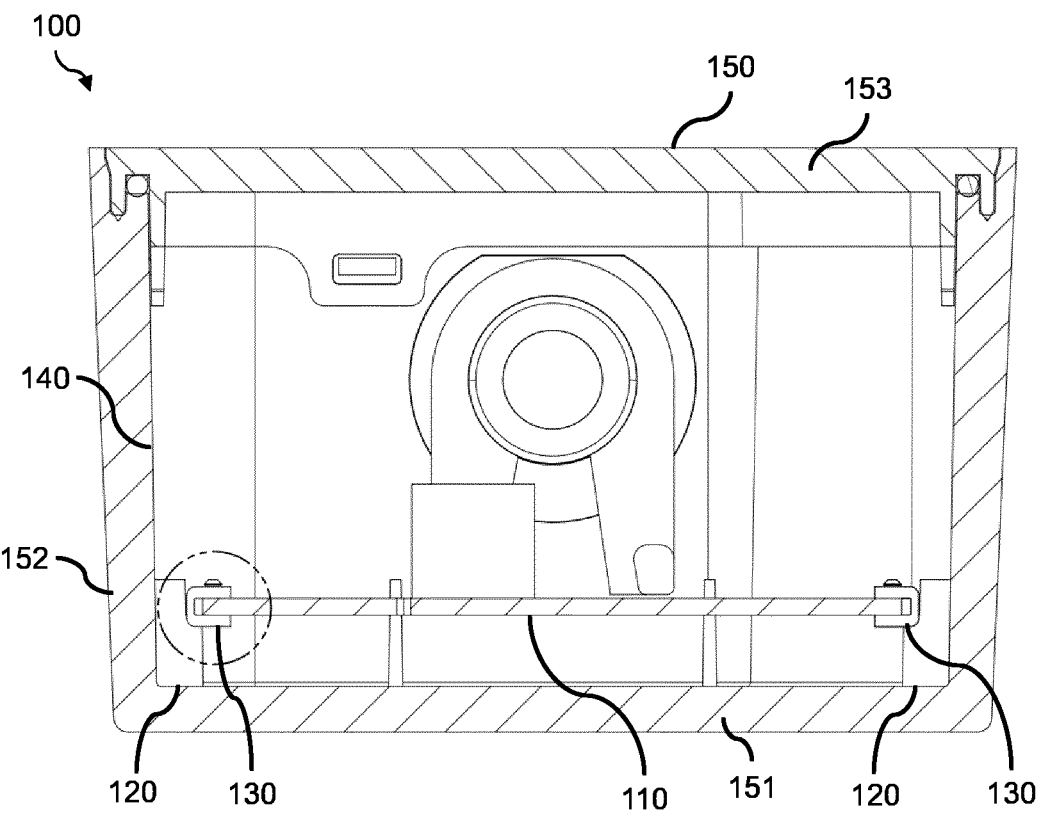
FIG. 1 is a cross-sectional view of an electrical device.

The invention will be described with reference to the Figures.

It should be understood that the detailed description and specific examples, while indicating exemplary embodiments of the apparatus, systems and methods, are intended for purposes of illustration only and are not intended to limit the scope of the invention. These and other features, aspects, and advantages of the apparatus, systems and methods of the present invention will become better understood from the following description, appended claims, and accompanying drawings. It should be understood that the Figures are merely schematic and are not drawn to scale. It should also be understood that the same reference numerals are used throughout the Figures to indicate the same or similar parts.

The invention provides a mechanism for providing ingress protection for an electrical device. A protective element is coupled between an electrical element and a support element supporting the electrical element. Potting material covers exposed areas of the electrical element, support element and protective element. The adhesion between the protective element and the potting material is greater/stronger than between the support element and the potting material.

Embodiments are based on the realization that direct contact between a support element/structure and an electrical element reduces an ingress protection of the electrical element against foreign matter, especially as the support element becomes detached from potting material over time. Providing a protective element between the support and electrical elements separates the two structures from one another. More closely/strongly adhering the protective element to the potting material, compared to the support element, prevents/blocks a path from forming between the support element and the electrical element along which foreign matter can move. Approaches thereby provide an electrical device having improved, and longer lasting, ingress protection.

Embodiments may be employed in any suitable electrical device for which ingress protection is required.

FIG. 1 illustrates an electrical device 100 according to an embodiment. The electrical device 100 comprises an electrical element 110, a support element 120, a protective element 130 and potting material 140.

The illustrated electrical device also comprises a housing 150. The housing 150 is configured to enclose, house or encapsulate the other elements/features of the electrical device 100. The housing may be formed of any suitable material, e.g., plastic or metal.

The electrical element 100 is any structure or apparatus that comprises or carries one or more electrical components and/or conductive elements for performing an electrical function. The illustrated electrical element 100 is a circuit board, specifically a printed circuit board, mounting a plurality of electrical components (e.g., resistors, capacitors, inductors, semi-conductor devices such as microprocessors, transistors or diodes, and so on) and providing electrical connections between the electrical components. Other suitable examples of electrical elements would be apparent to the skilled person.

The support element 120 is configured to support the electrical element 100, e.g., within the housing 150. For instance, a weight of the electrical element 100 may be supported or held by the support element.

The electrical device 100 may comprise a plurality of support elements 120, each of which may perform a similar function.

The support element 120 may be configured to separate or distance the electrical device from at least one side 151, 152, 153 of the housing 150. The illustrated support element 120 distances and separates the electrical device from a first 151 and second 152 side of the housing 150. The support element has an L-shaped form structure for separating the electrical device 110 from both of these sides 151, 152 of the housing 150.

The protective element 130 is coupled between the electrical element 110 and the support element 120. The protective element 130 thereby acts as a barrier between the electrical element 110 and the support element 120, to prevent or reduce passage of (any) foreign material present at the support element 120 to the electrical element 110. In particular, the protective element 130 may be positioned and/or configured to prevent direct contact between the electrical element 110 and the support element 120. Rather, the electrical element 110 and the support element 120 may only be in indirect contact with one another, via the protective element 130.

In some examples, the protective element 130 may be secured or fastened to the electrical element 110, e.g., to reduce or restrict a movement of the protective element 130 with respect to the electrical element.

If the electrical device 100 comprises a plurality of support elements 120 supporting the electrical element 110, then a respective protective element 130 may couple each support element 120 to the electrical element 110. Each protective element may perform a similar function.

The potting material 140 is configured to cover exposed areas, e.g., all exposed areas, of the electrical element, exposed areas of the support element(s) and exposed areas of the protective element(s). Exposed areas include any area that would otherwise be exposed to air if the electrical device was positioned in air. Thus, the exposed areas would not include any interface of direct contact between the electrical element and the protective element and/or any interface of direct contact between the protective element and the support element.

Appropriate constituents for potting materials are well known in the art, and would be readily apparent to the skilled person familiar with electronic assemblies. Suitable examples include a silicon-based resin, polyurethane-based glue, tar and/or epoxy resins.

The electrical device 100 is configured such that the adhesion (e.g., measurable as the adhesive strength per unit area) between the potting material 140 and the protective element 130 is greater than the adhesion between the potting material 140 and the support element 120.

Differences in adhesion between the potting material and the protective/support element can be achieved through selection of appropriate material. For instance, the surface energy of the protective element may be greater than the surface energy of the support element (to achieve greater adhesive strength per unit area). As an example, the surface energy of the protective element is no less than 35 mJ/m$^2$, e.g., no less than 38 mJ/m$^2$, e.g., no less than 40 mJ/m$^2$. In particular, the protective element may be formed of a high surface energy plastic. The greater the surface energy of the protective element, the greater the adhesive strength and therefore more effective the protective element at performing its task.

The support element(s) 120 and the protective element(s) 130 may therefore be made of different materials or different varieties of a material, having different surface energies.

The protective element may be formed of silicone, plastic, rubber, polymeric material, and/or a composite of silicone, plastic, rubber and/or polymeric material. For instance, the protective element may be formed of silicone, silicone rubber, styrene-butadiene rubber, polyamide or nylon, polyurethane, poly(methylmethacrylate), polystyrene, poly(vinylchloride) (PVC) and/or polyethylene terephthalate (PET).

Table 1 indicates the relationship between some suitable example materials for the protective element and the corresponding surface energy in mJ/m$^2$. This table is not exhaustive, and other examples will be apparent to the skilled person.

TABLE 1

| Material | Surface Energy (mJ/m$^2$) |
| --- | --- |
| Styrene-Butadiene Rubber (SBR) | 48 |
| Polyamide (PA) or Nylon | 38-46 |
| Polyurethane (PU) | 43 |
| Polyethylene Terephthalate (PET) | 41 |
| Poly(vinylchloride) | 35-39 |
| Polystyrene | 36 |

Approaches for determining a surface energy are well known in the art, and commonly use contact angle experiments or the like. A number of approaches are disclosed by Hejda, F., P. Solar, and J. Kousal. "Surface free energy determination by contact angle measurements—a comparison of various approaches." WDS. Vol. 10. 2010.

Providing a protective element 130 having a greater adhesion to the potting material 140 than the support element 120 improves an ingress protection of the electrical element 110 compared to an electrical device with no protective elements that is otherwise identical. This improves a lifetime of the electrical device 100, even in exposed environments such as the outdoors.

By way of explanation, it is noted or expected that over time, an adhesion between the potting material 140 and the support element 120 will deteriorate, allowing the ingress of foreign material (e.g., water or moisture) to a surface of the support element (e.g., via a side 151, 152 of the housing 150). This is because the potting material 140 will become detached from the support element 120. This effect is enhanced if the potting material also becomes detached from the side(s) 152 of the housing 150 (which may be formed of the same material as the support element 120), thereby providing a direct route for transmission of foreign material towards the support element. If the support element 120 were in direct contact with the electrical element 110, then this foreign material would easily travel/transfer to the electrical element, resulting in foreign material (e.g., water or moisture), being present at the electrical element.

The protective element 130 serves to provide a barrier against this direct transmission. By configuring the protective element 130 to have a greater adhesion with the potting material 140 (compared to the support element 120), then at the point in time that the potting material becomes detached from the support element, the potting material will remain attached to the protective element, due to the greater adhesion. This strong adhesion between the potting material 140 and the protective element 130 will thereby cause the potting material, or the interface between the potting material and the protective element, to prevent or reduce migration of foreign matter present at the surface of the support element 120 from travelling along the surface of the protective element 130 towards the electrical element, at least at a time that the support element first becomes detached from the potting material.

In other words, the protective element 130 and the potting material 140 together act as a barrier to prevent the travel of foreign material (present in a gap formed between the potting material 140 and the support element 120) towards the electrical element 110.

A lifetime of the electrical device 100 is therefore improved by improving the ingress protection and durability of the electrical device using the proposed approach.

Figure 2:
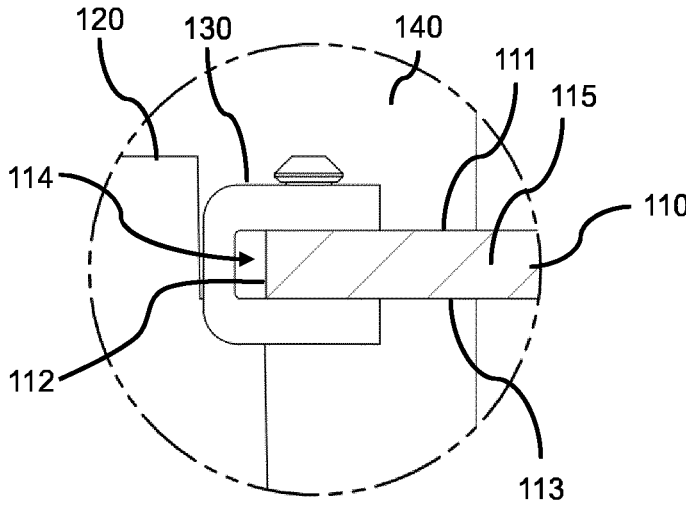
FIG. 2 provides an enlarged view of a portion of the electrical device.

FIG. 2 provides an enlarged view of the interface between the electrical element 110, the support element 120 and the protective element 130.

The protective element 130 is configured to wrap around a portion of an edge 114 of the electrical element 110 (here: a circuit board 115). The circuit board 115 is generally planar, such that the edge is defined as a side part of the board. This approach improves a protective performance of the protective element.

In particular, the protective element 130 is configured to cover a portion of three separate surfaces of the circuit board of the electrical element 110. The circuit board may comprise a first side 111, a second side 112 and a third side 113. The protective element is configured to wrap around a portion of these three sides 111, 112, 113 of the circuit board 115. This effectively acts to clamp the protective element 130 to the circuit board 115 to improve a structural integrity of the connection. This approach also reduces a likelihood or probability that the electrical element 110 will come into contact with the support structure 120, e.g., due to errors in manufacturing processes, thereby improving a robustness of a manufacturing process for providing electrical devices with good levels of ingress protection.

Alternatively, in case the support element has an L-shaped form structure for separating the electrical device 110 from the sides of the housing 150, the protective element 130 may also in an L-shaped form to space the support element 120 from the circuit board 115. In other words, the protective element may be configured to wrap around only a portion of two sides 112 and 113 of the circuit board 115.

Figure 3:
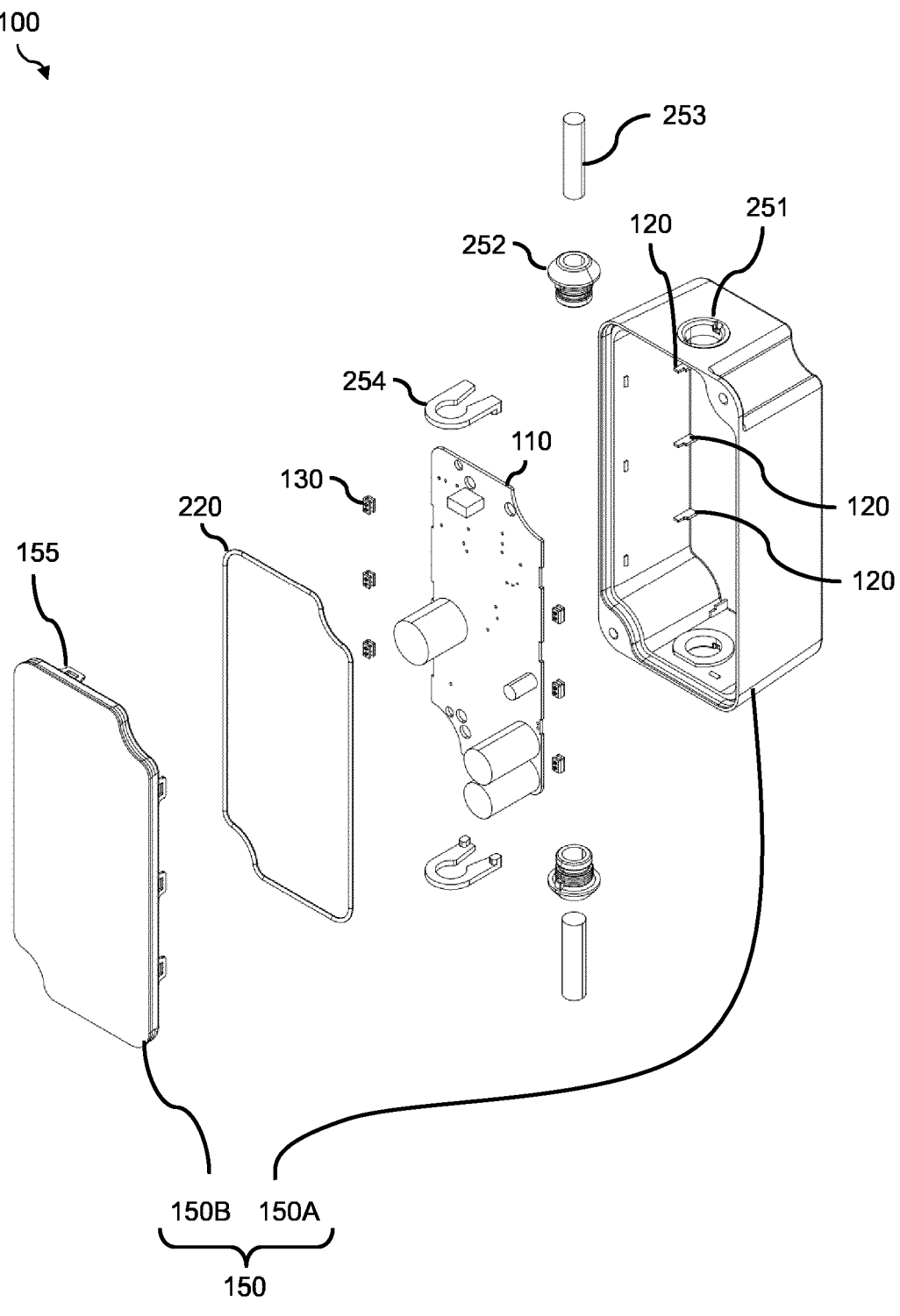
FIG. 3 is an exploded view of the electrical device.

FIG. 3 provides an exploded view of the electrical device 100.

The electrical device 100 still comprises an electrical element 110, support elements 120, protective elements 130 and potting material 140 (not shown in FIG. 3, but to be filled in the space within the housing 150). The electrical device 100 also includes the housing 150.

The housing 150 is formed in two parts 150A. 150B. A first part 150A support the support elements 130 and provides a base and side walls. A second part 150B forms a lid that is couplable to the first 150B, e.g., via one or more fastening elements 155. The two parts, when coupled together, form an enclosure for the electrical device. After the other elements of the electrical device are positioned with this enclosure, the enclosure may be filled with the potting material (not shown).

The support element(s) 120 may be integrally formed with the housing 150, e.g., so that they form one continuous material and could be manufactured simultaneously.

To provide additional ingress protection, a gasket 220 or O-ring may be provided that lies between the first part 150A of the housing and the electrical element 110. The gasket 220 may couple to the side walls of the first part 150A, e.g., to provide an additional barrier for the transmission or travel of foreign material down the side wall. The gasket may also provide a barrier for foreign material that may enter, for instance, if the second part 150B of the housing 150 is separated from the second part 150A.

The gasket 220 may comprise be formed of a flexible material (e.g., silicone or rubber) for providing a seal against the side walls of the first part 150A of the housing 150.

To facilitate electrical communication between the electrical device 110 and external electrical devices (not shown), the housing 150 may comprise one or more apertures 251. An aperture plug 252, formed of a flexible material and having a throughhole, may be positioned in the/each aperture 251. A wire conduit 253, e.g., a pipe, may be positioned in the throughhole of the/each aperture plug 252 and fed through towards the electrical element 110. The/each wire conduit is sized to allow the passage of one or more (electrical) wires therethrough. This provides a path for wires to enter the housing and reach the electrical element 110. Any wires within the enclosure of the housing 150 may be coated in the potting material for improved ingress protection.

The aperture plug 252 is configured to seal against the ingress of material externally to the housing towards the electrical element 110, e.g. to reduce or prevent gaps from appearing between the aperture plug 252 and the aperture 251 and/or between the aperture plug 252 and the wire conduit 253. This is achieved by forming the aperture plug from a flexible material, such as rubber, that acts to prevent the formation of gaps.

The electrical device 100 may comprise a conduit spacer 254, configured to separate the electrical element 110 from the aperture 251 and/or wire conduit 253 and/or prevent or restrict a movement of the electrical element 110 towards the aperture 251 and/or wire conduit. The conduit spacer 254 has several functions. By spacing the electrical element 110 from the aperture 251, a space between the electrical element and the aperture can be filled with potting material to improve the ingress protection of the electrical device 100.

Moreover, the conduit space 254 can act to reduce a potential or possible movement of the electrical element, to increase a mechanical robustness of the electrical device 100. The conduit spacer 254 may be directly coupled to the wire conduit 253 and/or the aperture plug 252.

Of course, elements 251 to 254 may be omitted if the electrical device 100, particularly the electrical element 110, does not need to communicate with any external electrical element.

Figure 4:
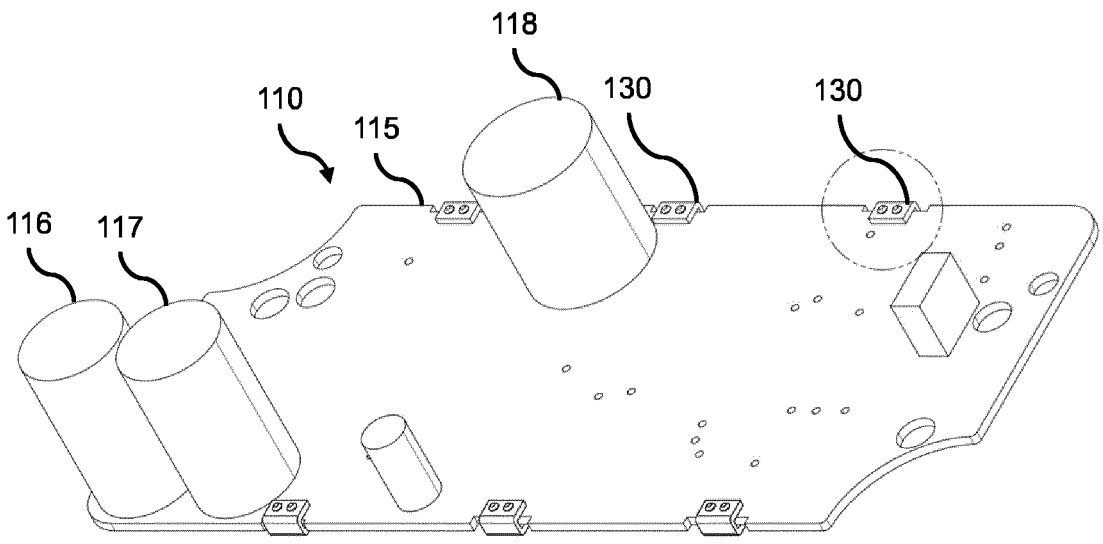
FIG. 4 illustrates an electrical element and protective elements of the electrical device.

FIG. 4 illustrates an electrical element 110 for use in examples.

The electrical element 110 comprises a circuit board 115 and a plurality of electrical components 116, 117, 118 mounted upon the circuit board. An electrical component is any suitable electrical component for use in an electronic circuit, e.g., a resistor, a capacitor, an inductor, a semiconductor device (such as a microprocessor, transistor or diode) and so on. The circuit board may comprise one or more electrical connectors (not visible) for connecting the electronic components to one another.

The electrical element 110 may, for instance, be a driver arrangement for a lighting system. The proposed invention is particularly advantageous for such an embodiment, as outdoor lighting systems require driving arrangements and there is a strong desire to protect any driving arrangements from long-term exposure to foreign matter/material such as moisture or water, as lighting systems are typically a semi-permanent installation. The proposed approach is therefore particularly advantageous for improving the longevity of external or outdoors lighting arrangement.

FIG. 4 also illustrates a plurality of protective elements 130 mounted to the electrical element 110. Each protective element is positioned within a cut-out or indentation of the circuit board 115.

Figure 5:
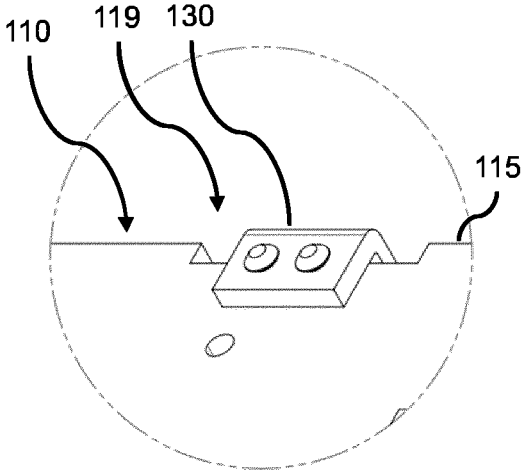
FIG. 5 provides a view of an interface between the electrical element and the protective element.

FIG. 5 provides an enlarged view of the interface between a protective element 130 and the circuit board 115 of the electrical element 110. In particular, FIG. 5 more clearly illustrates how the protective element 130 can be positioned within a cut-out or indentation 119 of the circuit board.

The cut-out or indentation 119 means that existing support elements and/or designs for the same, which are designed for use with circuit boards without indentations and disconnected from any protective elements, can be used with circuit boards connected to protective elements. The indentation(s) 119 can result in the combination of the circuit board 115 and any protective elements 130 having a same or smaller footprint as existing circuit boards (with no indentations and no protective elements). Thus, existing support elements can be reused with the new circuit board and protective element combinations, improving an ease of manufacturing and transition to manufacturing embodiments of the invention.

The indentation(s) 119 also improve a robustness of the electrical device 100 or manufacturing the same, e.g., by reducing a chance that the protective element(s) 130 will be knocked or damaged during manufacturing or assembling of the electrical device. This is because the protective elements will be less prominent, and therefore less susceptible to damage.

Thus, the circuit board 115 may comprise one or more cut-outs or indentations 119. The protective element 130 may be configured to connect to the circuit board 115 at a cut-out or indentation 119 of the circuit board.

It has previously been explained how the protective element(s) may be secured or fastened to the electrical element. In some examples, to achieve this functionality, the protective element comprises one or more fasteners configured to fasten or secure the protective element to the electrical element.

FIGS. 6 to 9 illustrate one example of a protective element 130 having a fastener 135 for securing or fastening the protective element 130 to the electrical element.

The fastener 135 is formed of a first fastening portion 135A and a second fastening portion 135B. The first fastening portion 135A is sized and/or configured to pass through a hole of the electrical element. The second fastening portion 135B is configured to engage with the first fastening portion 135A. The engagement is such that, when the first fastening portion is threaded through the hole of the electrical element, the movement of the first fastening portion is prevented or restricted, thereby fastening the protective element to the electrical element.

Figure 6:
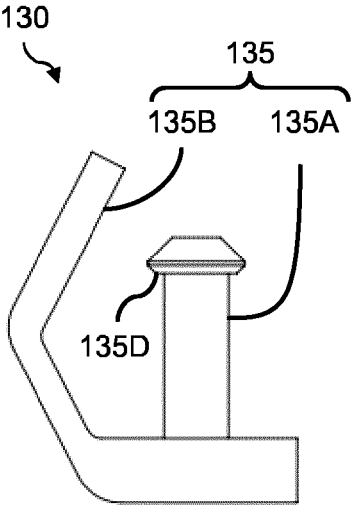
FIG. 6 is a side view of a protective element in an open configuration.
Figure 7:
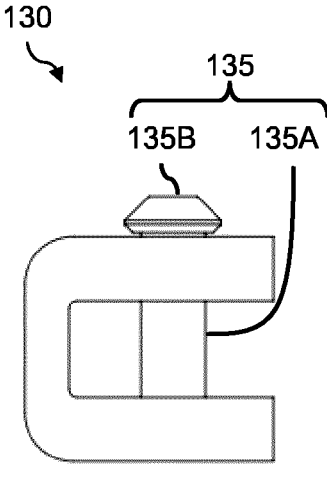
FIG. 7 is a side view of the protective element in a closed configuration.
Figure 8:
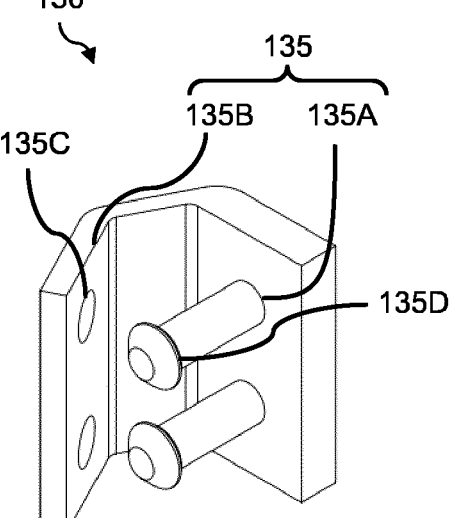
FIG. 8 is a perspective view of the protective element in an open configuration.
Figure 9:
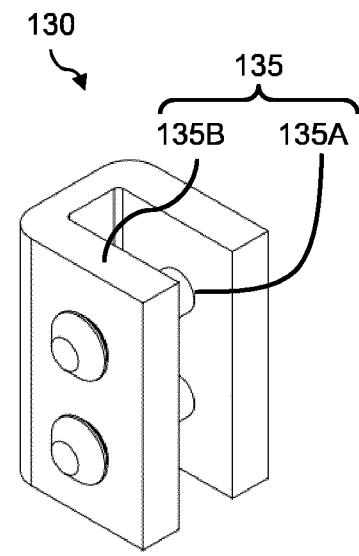
FIG. 9 is a perspective view of the protective element in a closed configuration.

FIGS. 6 and 8 provide two different views of the fastener in an unfastened or open configuration. FIGS. 7 and 9 provide two different views of the fastener in a fastened or closed configuration.

In the illustrated example, the second fastening portion 135B is configured to clip or snap to the first fastening portion 135A. In particular, the second fastening portion comprises a hole 135C through which the first fastening portion 135A passes. The first fastening portion 135A comprises a barb or tapered tip 135D. The barb/tip 135D acts to restrict retraction of the first fastening portion 135A back through the hole 135C of the second fastening portion 135B, thereby clipping the first and second portions together.

The illustrated fastener provides a simple and intuitive approach for fastening or securing the protective element to the electrical element, increasing an ease of assembling the electrical device.

Other suitable fasteners for connecting the protective element to the electrical element would be apparent to the skilled person, such as a screw and bolt mechanism.

Variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

If the term "adapted to" is used in the claims or description, it is noted the term "adapted to" is intended to be equivalent to the term "configured to". If the term "arrangement" is used in the claims or description, it is noted the term "arrangement" is intended to be equivalent to the term "system", and vice versa. Any reference signs in the claims should not be construed as limiting the scope.

The invention claimed is:

1. An electrical device comprising:
   an electrical element;
   a support element for supporting the electrical element;
   a housing configured to house the electrical element, wherein the support element is coupled to the housing and is configured to support the electrical element within the housing; wherein the support element is configured to support the electrical element away from at least one side of the housing;
   a protective element coupled between the electrical element and the support element; and
   potting material configured to cover exposed areas of the electrical element, exposed areas of the support element and exposed areas of the protective element, wherein the adhesion between the protective element and the potting material is stronger than the adhesion between the support element and the potting material; wherein the electrical element comprises a circuit board, wherein the protective element is configured to wrap around a portion of an edge of the circuit board.

2. The electrical device of claim 1, wherein the surface energy of the protective element (130) is greater than the surface energy of the support element.

3. The electrical device of claim 1, wherein the surface energy of the protective element is no less than 35 mJ/m$^2$.

4. The electrical device of claim 3, wherein the surface energy of the protective element is not less than 38 mJ/m$^2$.

5. The electrical device of claim 1, wherein the circuit board is a printed circuit board.

6. The electrical device of claim 1, wherein the protective element is configured to cover a portion of at least three surfaces of the circuit board.

7. The electrical device of claim 1, wherein the protective element is formed of silicone, plastic, rubber, polymeric material, and/or a composite of silicone, plastic, rubber and/or polymeric material.

8. The electrical device of claim 1, wherein the protective element is formed of silicone, silicone rubber, styrene-butadiene rubber, polyamide or nylon, polyurethane, poly(methylmethacrylate), polystyrene, poly(vinylcloride) and/or polyethylene terephthalate.

9. The electrical device of claim 1, wherein the protective element comprises one or more fasteners configured to fasten or secure the protective element to the electrical element.

10. The electrical device of claim 9, wherein each of the one or more fasteners comprises:

a first fastening portion sized and/or configured to pass through a hole of the electrical element; and a second fastening portion configured to engage with the first fastening portion to thereby prevent or restrict the movement of the first fastening portion through the hole of the electrical element, to thereby fasten or secure the protective element to the electrical element.

11. The electrical device of claim 10, wherein the second fastening portion is configured to clip to the first fastening portion to thereby engage with the first fastening portion.

12. The electrical device of claim 1, wherein the potting material comprises a silicon-based resin, an epoxy resin, a polyurethane-based glue or tar.

13. The electrical device of claim 1, wherein the electrical device comprises:

a plurality of support elements for supporting the electrical element;

a plurality of protective elements, each protective element being coupled between the electrical element and a respective support element, wherein:

the potting material is configured to cover exposed areas of each support element and exposed areas of each protective element; and the adhesion between each protective element and the potting material is greater than the adhesion between each support element and the potting material.

* * * * *